(12) United States Patent
Naftali et al.

(10) Patent No.: US 7,428,850 B2
(45) Date of Patent: Sep. 30, 2008

(54) INTEGRATED IN SITU SCANNING ELECTRONIC MICROSCOPE REVIEW STATION IN SEMICONDUCTOR WAFERS AND PHOTOMASKS OPTICAL INSPECTION SYSTEM

(75) Inventors: Ron Naftali, Shoham (IL); Yoram Uziel, Post Misgav (IL); Ran Vered, Nechalim (IL); Eitan Pinhasi, Beny-Brak (IL); Igor Krivts (Krayvitz), Rehovot (IL)

(73) Assignee: Applied Materials, Israel,Ltd., Rehovot (IL)

( * ) Notice: Subject to any disclaimer, the term of this patent is extended or adjusted under 35 U.S.C. 154(b) by 189 days.

(21) Appl. No.: 11/359,100

(22) Filed: Feb. 22, 2006

(65) Prior Publication Data
US 2007/0022831 A1    Feb. 1, 2007

Related U.S. Application Data

(60) Provisional application No. 60/656,323, filed on Feb. 24, 2005.

(51) Int. Cl.
*G01M 19/00* (2006.01)
(52) U.S. Cl. .................................................. 73/865.8
(58) Field of Classification Search ........................ None
See application file for complete search history.

(56) References Cited

U.S. PATENT DOCUMENTS

| | | | |
|---|---|---|---|
| 4,926,118 A * | 5/1990 | O'Connor et al. ............ 324/760 |
| 5,227,717 A * | 7/1993 | Tsurishima et al. ......... 324/754 |
| 7,035,003 B2 * | 4/2006 | Peiter et al. .................. 359/368 |
| 2004/0124863 A1 * | 7/2004 | Hubner et al. ............... 324/754 |
| 2005/0139781 A1 * | 6/2005 | Hazaki et al. ........... 250/442.11 |
| 2005/0211920 A1 * | 9/2005 | Shibata ..................... 250/492.2 |
| 2006/0060259 A1 | 3/2006 | Devitt |

* cited by examiner

*Primary Examiner*—Robert R Raevis
(74) *Attorney, Agent, or Firm*—Tarek N. Fahmi

(57) ABSTRACT

A substrate inspection system includes two or more inspection modules supported on a plate. A chamber is supported beneath the plate by a translation system, which is configured to provide horizontal displacement of the chamber under the plate to permit loading and unloading of a substrate to/from the chamber. Thus, when the chamber is in a loading/unloading position it is at least partially uncovered from the plate. The translation system may be further configured to provide vertical displacement of the chamber with respect to the plate so as to position an upper surface of a wall of the chamber in close proximity to a lower surface of the plate when the chamber is in an inspection position. In such a position, the upper surface of the wall of the chamber and the lower surface of the plate may be separated by an air gap.

20 Claims, 2 Drawing Sheets

INTEGRATED IN SITU SCANNING ELECTRONIC MICROSCOPE REVIEW STATION IN SEMICONDUCTOR WAFERS AND PHOTOMASKS OPTICAL INSPECTION SYSTEM

RELATED APPLICATIONS

This application is a NONPROVISIONAL of, claims priority to and incorporates by reference U.S. Provisional Patent Application 60/656,323, filed 24 Feb. 2005.

FIELD OF THE INVENTION

The present invention relates to inspection systems for use during semiconductor processing and, more particularly, to such systems as employ moveable chambers for containing wafers, reticles and the like during processing or inspecting thereof.

BACKGROUND

As explained in commonly-owned U.S. Pat. No. 6,899,765, incorporated herein by reference, inspection tools are used in the semiconductor industry for examining semiconductor wafers and photomasks (also known as reticles) at different steps of their respective manufacturing processes. For those less familiar with such matters, during processing the wafers or photomasks are patterned, layer-after-layer, to form a final device. This may involve the deposition, patterning, and/or removal of material on or from semiconductor or other substrates. Because it is important that each of these steps be completed to a high degree of accuracy, the substrates are frequently examined (using inspection tools such as microscopes and the like) during the various processing steps to ensure that they remain as free from defects as is practicable.

The size of defects on or in such substrates tends to be very small; for example, on the order of 50 to 100 nm. While such defects are within the resolution capability of optical inspection tools, those tools must operate quickly and without generating too many false alarms (reported defects which are in fact not defects but random noise created during inspection). In some cases, suspected defects must be further reviewed to confirm their presence or absence, but defect review tools configured for such operations tend to function much more slowly than the optical inspection tools. Moreover, these defect review tools (such as scanning electron microscopes (SEMs) and the like) may need to operate under different conditions than the optical inspection tools (e.g., under an ultra clean, deep vacuum on the order of $10^{-6}$ torr), and so having to switch operating environments for the different inspection/defect review operations tends to further reduce overall throughput for a substrate inspection system.

What is needed then is a system that permits more rapid inspection and defect review of substrates and which is capable of accommodating the different operating environments demanded by such inspection and defect review equipment.

SUMMARY OF THE INVENTION

In one embodiment of the invention, a substrate inspection system includes two or more inspection modules supported on a plate. A chamber is supported beneath the plate by a translation system, which is configured to provide horizontal displacement of the chamber under the plate to permit loading and unloading of a substrate to/from the chamber. Thus, when the chamber is in a loading/unloading position it is at least partially uncovered from the plate. The translation system may be further configured to provide vertical displacement of the chamber with respect to the plate so as to position an upper surface of a wall of the chamber in close proximity to a lower surface of the plate when the chamber is in an inspection position. In such a position, the upper surface of the wall of the chamber and the lower surface of the plate may be separated by an air gap (e.g., an air bearing), although this air gap may be eliminated by evacuating same via a vacuum groove when it is desirable to fixedly position the two structures with respect to one another.

To facilitate the above-described operations, one or the other of the upper surface of the wall of the chamber or the lower surface of the plate may include the annular vacuum groove configured so as to provide for gas between said upper surface of the wall of the chamber and said lower surface of the plate to be evacuated. Likewise, one of the upper surface of the wall of the chamber or the lower surface of the plate may include an annular air bearing groove configured so as to provide for introducing gas between said upper surface of the wall of the chamber and said lower surface of the plate (e.g., to provide the air bearing).

The various inspection modules supported by the plate may include a scanning electron microscope, an optical microscope and/or a charged particle beam inspection module.

A further embodiment of the invention provides for laterally translating a chamber having an outer wall beneath a plate supporting two or more inspection modules thereon so as to permit loading or unloading of a substrate to/from the chamber. In a loading/unloading position the chamber is at least partially uncovered from the plate. Translating the chamber beneath the plate may be done while maintaining an upper surface of the outer wall of the chamber in close proximity to a lower surface of the plate so as to position a substrate included in the chamber under one or more of the inspection modules. The chamber may be so translated on an air bearing maintained between the upper surface of the outer wall of the chamber and the lower surface of the plate.

If desired, any gas between the upper surface of the outer wall of the chamber and the lower surface of the plate may be evacuated via an annular vacuum groove in either of the upper surface of the outer wall of the chamber or the lower surface of the plate. Such a gas may be introduced between the upper surface of the outer wall of the chamber and the lower surface of the plate via an annular air bearing groove in either of the upper surface of the outer wall of the chamber or the lower surface of the plate.

Still another embodiment of the present invention provides multiple substrate inspection modules supported on a plate that is disposed over a horizontally translatable chamber configured to be placed in close proximity to a lower surface of the plate so as to permit inspection of a substrate included in the chamber by one or more of the inspection modules. The chamber may be supported by a translation system configured to provide horizontal displacement of the chamber so as to permit loading and unloading of the substrate to/from the chamber by uncovering at least a portion of the chamber from under the plate. At least one of an upper surface of a wall of the chamber or a lower surface of the plate may include an annular vacuum groove configured so as to provide for gas between the upper surface of the wall of the chamber and the lower surface of the plate to be evacuated. Likewise, the upper surface of the wall of the chamber or the lower surface of the plate may include an annular air bearing groove configured so as to provide for introducing gas between the upper surface of the wall of the chamber and the lower surface of the plate.

BRIEF DESCRIPTION OF THE DRAWINGS

The present invention is illustrated by way of example, and not limitation, in the figures of the accompanying drawings, in which.

DETAILED DESCRIPTION

Described herein are solutions for integrating multiple defect inspection and/or review capabilities (e.g., using optical inspection and SEM defect review tools, respectively) for examining substrates (such as semiconductor wafers and masks), which solutions also include a dynamically, air bearing-sealed chamber within which the substrates are received. The chamber, which may be rapidly pumped down to an ultra high vacuum of the type required for SEM operations, is configured to contain the substrate and is translatable (and, optionally rotatable) so as to be capable of positioning the substrate beneath either (or any) of the inspection/defect review tools. The dynamic seal is achieved by pressing the chamber and a static plate (which is configured to support the defect inspection and review tools) together so as to provide a narrow, low-contact or contact-less interface between the two structures. Air pressure differentials may be used to prevent leakage into or out of the chamber via this interface. In one embodiment of the invention, the dynamic seal may be similar to an air bearing vacuum seal described in the above-cited '765 patent and/or commonly-owned U.S. Pat. No. 6,163,033, incorporated herein by reference.

Although the present invention will be described with reference to several illustrated embodiments thereof, these examples are not intended to limit the broader scope of the invention. Hence, the reader should refer to the claims following this description in order to appreciate the full extent of the invention. Moreover, the methods and apparatus described herein may be used in conjunction with a stand alone inspection system or with an inspection system that is part of a so-called "cluster tool", as described more fully in the '765 patent. Such cluster tools utilize less factory space than stand-alone devices, and therefore often represent a more economical solution for semiconductor manufacturers than do separate processing and inspections stations.

As indicated, the present invention enables the integration of optical and electronic microscope heads (and/or other inspections/defect review tools) on top of a substrate translation stage and miniature, substrate dynamic chamber. This reduces significantly the size and complexity of a tool combining inspection with defect review capabilities.

Figure 1:
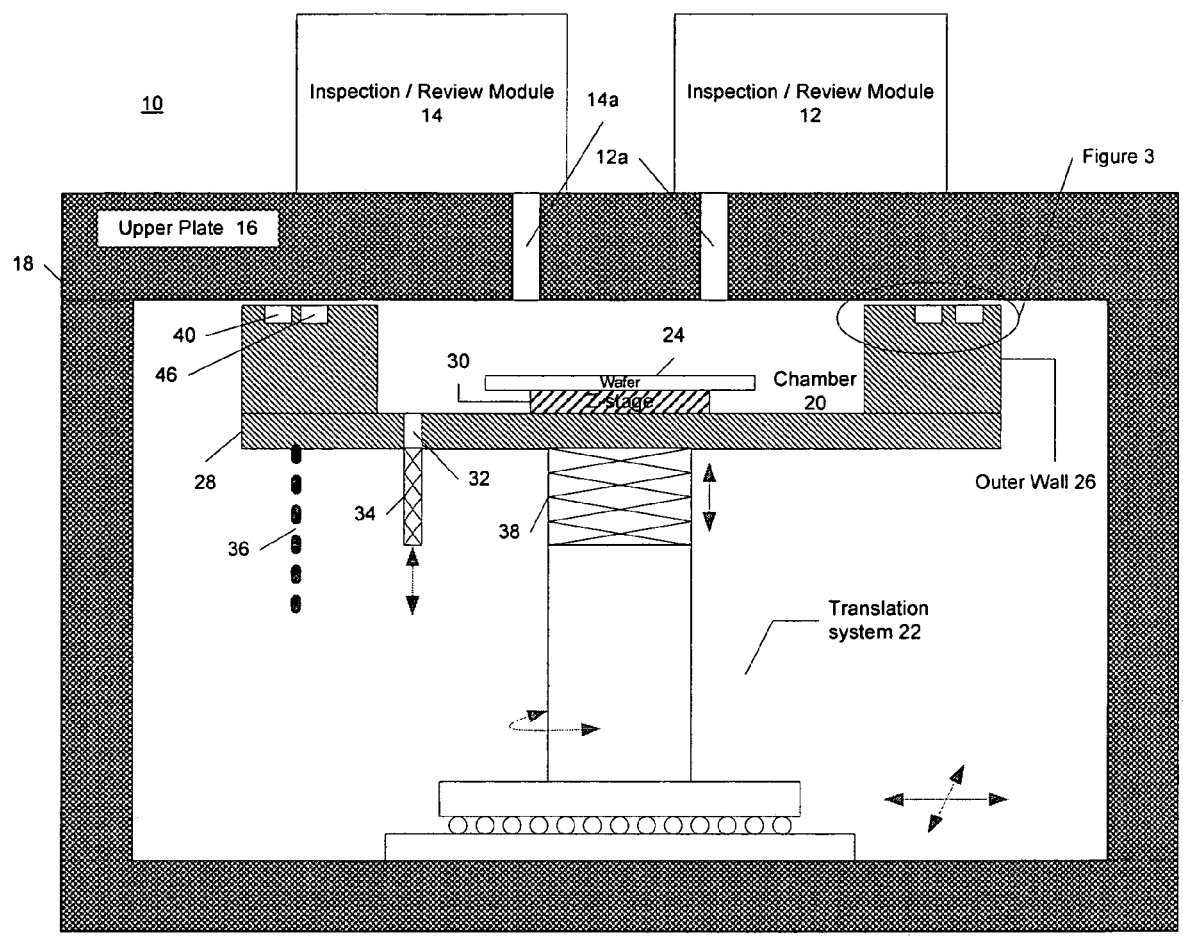
FIG. 1 illustrates a substrate inspection system configured with multiple inspection modules supported on a plate and a chamber supported beneath by a translation system configured to provide horizontal displacement of said chamber under said plate to permit loading and unloading of a substrate to/from the chamber in accordance with an embodiment of the present invention.

Referring then to FIG. 1, a system 10 configured according to one embodiment of the present invention incorporates two inspection/defect review modules, 12 and 14, though in other embodiments of the invention more than two such modules may be included. The inspection/defect review modules 12 and 14 may be any such modules as are commonly used in the semiconductor manufacturing/inspection arts, and in one example may be an optical inspection head and an SEM review head. These modules are mounted on top of a plate 16, which is fixed to a static frame 18. Holes or other openings 12a and 14a are provided through upper plate 16 so as to facilitate the passage of photons, electrons, ions or other particles (as appropriate) use by the inspection/defect review modules 12 and 14.

Figure 2:
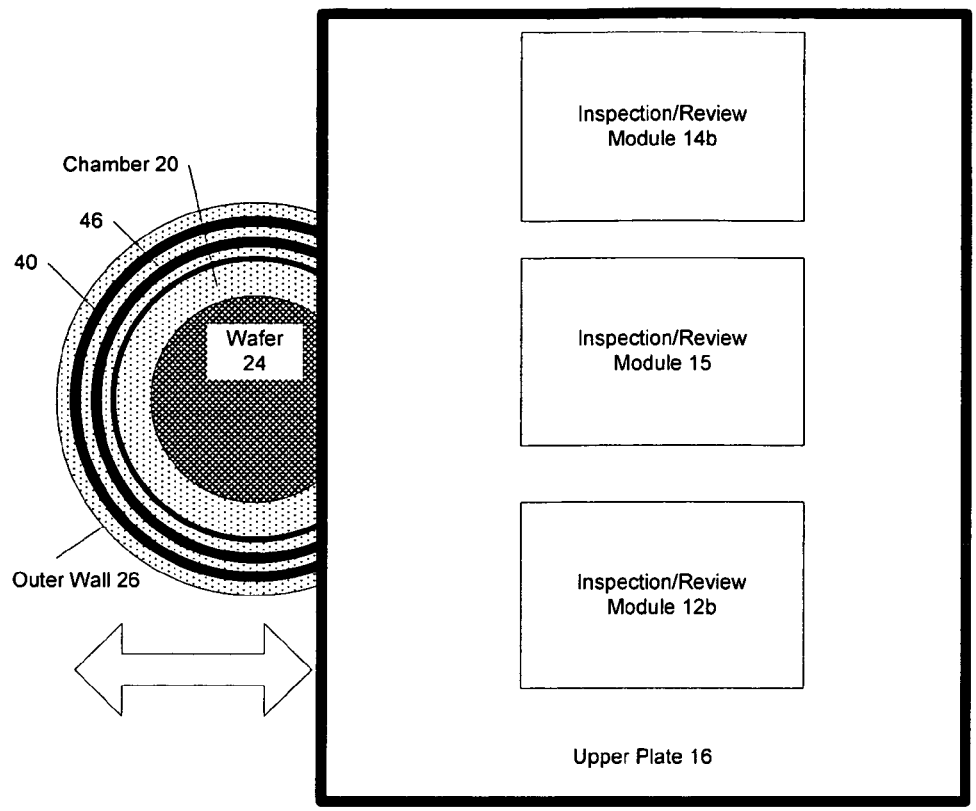
FIG. 2 is a top view of the system shown in FIG. 1, showing the chamber laterally displaced from underneath the plate supporting the inspection modules, so as to permit loading/unloading of the chamber in accordance with an embodiment of the present invention.

Under plate 16 there is a chamber 20, which as explained further below is configured to slide under the bottom face of the plate 16. During inspection operations, chamber 20 is maintained in close proximity to the plate 16 and is moved using an X-Y translation system 22. Referring briefly to FIG. 2, in one embodiment of the invention chamber 20 is circular in nature and has a diameter somewhat larger than the diameter of a wafer or other substrate 24. Notice that in the embodiment shown in FIG. 2, three inspection/defect review modules 12b, 14b and 15 are shown. As previously indicated, the precise number of such modules is not critical to the present invention and multiple such modules may be accommodated on plate 16, subject to size and weight constraints. For example, in addition to SEMs and/or optical microscopes, modules to permit electron beam inspection or other type of charged particle beam inspection and/or milling may be accommodated.

Referring again to FIG. 1, the chamber 20 may be defined by an outer wall 26 that includes dynamic seals and a lower plate 28, which may be welded or otherwise fixed together. In some cases the lower plate 28 and outer wall 26 may be a single unit. During inspection/defect review operations, a dynamic seal is formed between a lower surface of the upper plate 16 and an upper surface of the outer wall 26. The dynamic seal helps to maintain a desired pressure level (including varying degrees of vacuum) within the chamber 20, while the chamber 20 is being moved, for example, horizontally in a first direction and/or a second direction that is perpendicular to the first direction so as to position wafer 24 under one or the other of the inspection/defect review modules 12 or 14.

Within chamber 20, the wafer or other substrate 24 may be supported in an electrostatic chuck (not shown in detail) as is customary in inspection devices. The chuck may be positioned on a z-stage susceptor 30, configured to be raised or lowered using a piezo actuator. In this way the vertical position of the substrate 24 within the chamber 20 may be set at a desired height to facilitate inspection/defect review operations. The precise nature of the chuck and susceptor are not critical to the present invention.

The chamber 20 may be evacuated through an opening 32 in the lower plate 28 (or other opening). A flexible tubing 34 may be used to connect the chamber 20 to a vacuum pump (not shown) so that the chamber can be pumped down to appropriate vacuum levels to permit inspection/defect review operations. Such vacuum levels depend on the application and levels of $10^{-6}$ to $10^{-9}$ torr are common. Since the volume of the chamber 20 is very small (e.g., as compared to larger chambers used with conventional SEM tools), it is possible to switch from atmospheric pressure to deep vacuum pressures in a very short time (e.g., seconds), enabling the substrate 24 to move from inspection head to inspection head quickly. That is, the ability to rapidly pump down chamber 20 allows for the substrate 24 to be scanned under an optical inspection tool and then be rapidly moved under an SEM for review of any suspected defects. In addition, flexible connections 36 for providing air (or other gasses), electrical connections, etc. and also provided. Examples of flexible connectors and materials suitable for use in connection with system 10 are provided in the '765 patent.

Translation system 22 includes a vertically flexible portion 38, which allows chamber 20 to be raised and lowered. For example, the chamber 20 may be lowered to facilitate loading and unloading of the substrate 24. As shown in FIG. 2, such loading may occur while chamber 20 is horizontally displaced from its operational position under plate 16. That is, the chamber 20 may be lowered and then displaced horizontally, exposing the interior of chamber 20 so that substrates can be inserted into and/or removed therefrom. After such loading, the chamber 20 may be repositioned under plate 16 and then raised using the flexible portion 38 of the translation system so as to position the chamber 20 (and the substrate 24) in position for defect inspection and review.

In other embodiments, the chamber 20 is not so raised and lowered but instead relies solely on horizontal displacement for wafer loading/unloading operations. In such cases the flexible portion 38 is configured to permit such movement. Such horizontal displacement is permitted, in part, because of the air bearing provided between the upper surface of outer wall 26 and the lower surface of plate 16. In either case, vibration dampening systems such as those described in the '765 patent may be employed.

During inspection/defect review operations, chamber 20 is dynamically sealed while sliding against the plate 16 by a combination of air pressure and vacuum pressure grooves in the outer wall 26. The air pressure (e.g., approximately 4-8 atm) keeps the upper surface of the outer wall 26 of chamber 20 a few microns (e.g. 4-6 microns) away from the lower surface of plate 16, hence it can move with little or no friction (e.g., on an air bearing). The vacuum grooves help maintain the required vacuum level inside the chamber 20 by preventing air from entering the chamber 20.

Figure 3:
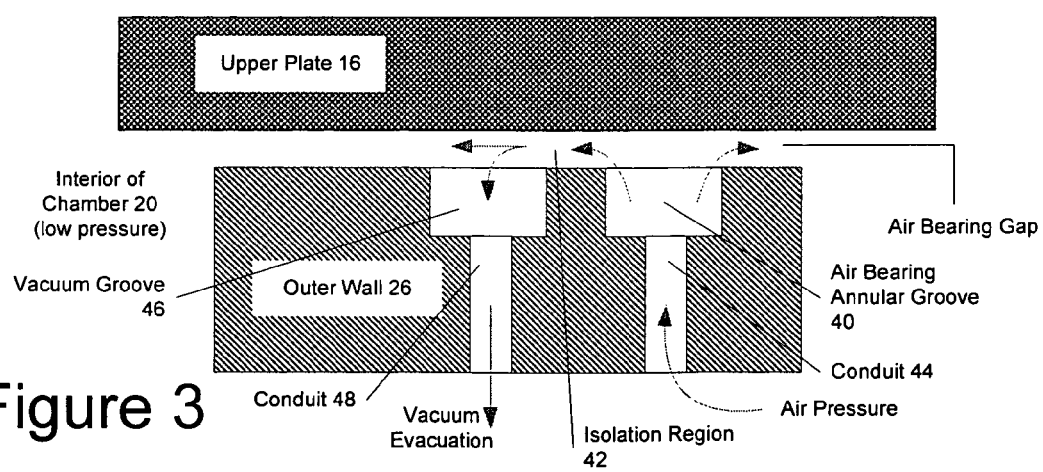
FIG. 3 illustrates a close up view of an air bearing gap which may be maintained between the plate and the chamber so as to permit relatively frictionless movement therebetween, in accordance with a further embodiment of the present invention.

FIG. 3 illustrates this arrangement in further detail. Although preferably planar, at the interface between the lower surface of plate 16 and the upper surface of outer wall 26, the relative surfaces may be curved (e.g., due to variations in manufacturing or machining of these elements). Either or both of these surfaces may be treated by coating or hardening to increase smoothness, prevent scratches and the like.

The dynamic seal system includes an air bearing annular groove 40 and an isolation region 42 (adjacent to groove 40) to provide a relatively contactless seal between the lower surface of plate 16 and the upper surface of outer wall 26 with a film of gas. As was the case for the air bearing system described in the '765 patent, a gas pump (not shown) provides compressed gas to the air bearing annular groove 40 via gas supply conduits 44 (which are connected to further supply lines (not shown). In various embodiments, more than one such air bearing annular groove and supply conduit may be used.

Positioned inboard and preferably concentrically (i.e., closed to chamber 20) to the air bearing annular groove 40 within outer wall 26 is a relatively high vacuum annular groove 46. This groove is fluidly coupled to a vacuum pump (not shown) through a vacuum conduit 48 and one or more exhaust conduits (not shown). During inspection/defect review operations, while gas is being pumped into the air bearing annular groove to provide the air bearing on which the chamber outer wall 26 floats beneath the plate 16, vacuum groove 46 is evacuated via conduit 48 so as to prevent significant quantities of gas from entering the interior of chamber 20, thereby preserving the relatively low pressure maintained therein. Collectively, these elements provide an integral dynamic seal for chamber 20 while still permitting relatively frictionless contact between the outer wall 26 and plate 16.

Note that in various embodiments of the invention, differing numbers of air bearing grooves and vacuum groves may be used. For example, such grooves may be arranged in a fashion similar to those discussed in the '765 patent so that they provide seals for increasing levels of vacuum going from outside the chamber to inside the chamber. The precise arrangement of the grooves, and their order, will depend on the application, the relative pressure differential inside and outside the chamber, and the like. The number of grooves is not critical, but may be varied as desired.

The gas and vacuum pumps may be operated separately, or under the control of a common system controller, for example a computer-based controller that also controls the translation of the chamber 20. Further, the groove structures may be provided within the plate 16, rather than in the outer wall 26. such placement is not critical to the present invention, it is the achievement of the dynamic seal that is important. Finally, in some cases it may be desirable to position the chamber in a desired inspection position and then eliminate the air gap by pumping down the chamber 20 and the vacuum groove 46 so as to rigidly position chamber 20 beneath plate 16. such operations may be needed, for example, when significantly high vacuums need to be maintained within chamber 20 or when chamber 20 is filled (at least partially) with a liquid to permit inspection of substrate 24 under a high numerical aperture apparatus.

Returning to FIG. 1, translation system 22 is configured to provide movement of the chamber 20 both laterally, in two perpendicular directions, vertically (e.g., to raise and lower the chamber) and, optionally, rotationally. In addition, the translation system 22 and/or the piezo actuator 30 may be configured to permit tilting of the chamber 20 and/or substrate 24, for example when such tilting is required as part of the inspection or defect review processes. Hence, the translation system 22 may be configured with multiple movement stages as discussed in detail in the '765 patent. The number of these stages, or their order of mounting, is not critical, and may be varied as desired, depending on the object to be accomplished. As was the case in the '765 patent, the movement system is mounted outside of the chamber 20, thus decreasing the potential for contamination of the interior of the chamber.

The present invention then satisfies difficult, specialized and very different demands of complex operations, as follows:

1. The design enables accurate, frictionless motion of the entire substrate under the optical inspection head at atmospheric pressure (i.e., the entire substrate area may be scanned to detect defects).
2. Optional positive pressure can be used to improve the resolution of the optical system (e.g., by immersion of the substrate in a material with refractive index greater than 1).
3. The design enables rapid dropping of the chamber pressure to deep vacuum level (e.g., as required for SEM or other operations).

The present inspection system is configured for rapid translation and other motion of the substrate between the various inspection modules so that information about a suspected defect can be obtained rapidly. This capability improves on-the-fly (i.e., real-time) defect review/classification and enables automatic optimization of the substrate inspection recipe used by a semiconductor manufacturer. The apparatus and methods discussed herein may be employed or embodied in connection with a stand alone inspection chamber and/or such a chamber as is integrated into a cluster tool, structural and operational details of such devices may be found in the '765 patent.

Thus, solutions for integrating multiple defect inspection and/or review capabilities into an inspection system have been described. Of course, the present invention may be embodied in forms or configurations other than the examples described above without departing from the essential characteristics thereof. Accordingly, the foregoing description is intended to be illustrative, but not limiting, of the scope of the invention which is best understood in the following claims.

What is claimed is:

1. A substrate inspection system, comprising two or more inspection modules supported on a plate and a chamber, defined by the plate, an outer wall and a lower plate, and supported beneath said plate by a translation system configured to provide horizontal displacement of said chamber under said plate to permit loading and unloading of a substrate to and from the chamber, respectively, such that when said chamber is in a position to permit said loading and unloading it is at least partially uncovered from said plate.

2. The substrate inspection system of claim 1, wherein the translation system is further configured to provide vertical displacement of the chamber with respect to the plate so as to position an upper surface of the outer wall of said chamber in close proximity to a lower surface of said plate when said chamber is in an inspection position.

3. The substrate inspection system of claim 2, wherein the upper surface of the outer wall of the chamber and the lower surface of the plate are separated by an air gap when said chamber is in the inspection position.

4. The substrate inspection system of claim 3, wherein the translation system is configured to displace said chamber laterally beneath said plate on an air bearing provided in said air gap when said chamber is in the inspection position.

5. The substrate inspection system of claim 2, wherein the upper surface of the outer wall of the chamber or includes an annular vacuum groove configured so as to provide for gas between said upper surface of the outer wall of the chamber and said lower surface of the plate to be evacuated.

6. The substrate inspection system of claim 5, wherein the upper surface of the outer wall of the chamber further includes an annular air bearing groove located radially outside of said annular vacuum groove and configured so as to provide for introducing gas between said upper surface of the outer wall of the chamber and said lower surface of the plate.

7. The substrate inspection system of claim 2, wherein one of the inspection modules comprises a scanning electron microscope.

8. The substrate inspection system of claim 2, wherein one of the inspection modules comprises an optical microscope.

9. The substrate inspection system of claim 2, wherein one of the inspection modules comprises a charged particle beam inspection module.

10. A method, comprising:
(i) laterally translating a chamber defined by a plate, an outer wall and a lower plate beneath said plate, which supports two or more inspection modules thereon, so as to permit loading or unloading of a substrate to or from, respectively, said chamber such that in a loading or unloading position the chamber is at least partially uncovered from said plate; and
(ii) evacuating gas from an opening in the chamber.

11. The method of claim 10, further comprising, translating the chamber beneath said plate while maintaining an upper surface of said outer wall in close proximity to a lower surface of said plate so as to position a substrate included in said chamber under one or more of the inspection modules.

12. The method of claim 11, wherein the chamber is translated on an air bearing maintained between the upper surface of the outer wall of the chamber and the lower surface of the plate.

13. The method of claim 11, further comprising evacuating gas between the upper surface of the outer wall of the chamber and the lower surface of the plate via an annular vacuum groove in the upper surface of the outer wall of the chamber.

14. The method of claim 13, further comprising introducing gas between the upper surface of the outer wall of the chamber and the lower surface of the plate via an annular air bearing groove in the upper surface of the outer wall of the chamber.

15. The method of claim 10, further comprising positioning the chamber under the plate so as to position a wafer within the chamber beneath one of the inspection modules.

16. The method of claim 15, further comprising evacuating gas between an upper surface of the outer wall of the chamber and a lower surface of the plate via an annular vacuum groove in the upper surface of the outer wall of the chamber.

17. The method of claim 16, further comprising introducing gas between the upper surface of the outer wall of the chamber and the lower surface of the plate via an annular air bearing groove in the upper surface of the outer wall of the chamber.

18. A system, comprising multiple substrate inspection modules supported on a plate that is disposed over a horizontally translatable chamber, the chamber defined by the plate, an outer wall and a lower plate and configured to be placed in close proximity to a lower surface of said plate so as to permit inspection of a substrate included in said chamber by one or more of the inspection modules, the chamber supported by a translation system configured to provide horizontal displacement of the chamber so as to permit loading and unloading of the substrate to and from, respectively, the chamber by uncovering at least a portion of the chamber from under the plate.

19. The system of claim 18, wherein an upper surface of the outer wall of the chamber includes an annular vacuum groove configured so as to provide for gas between said upper surface of the outer wall of the chamber and said lower surface of the plate to be evacuated.

20. The system of claim 19, wherein the upper surface of the outer wall of the chamber further includes an annular air bearing groove located radially outside of the annular vacuum groove and configured so as to provide for introducing gas between said upper surface of the outer wall of the chamber and said lower surface of the plate.

* * * * *